(12) United States Patent
Machida et al.

(10) Patent No.: US 7,180,199 B2
(45) Date of Patent: Feb. 20, 2007

(54) SEMICONDUCTOR DEVICE AND SEMICONDUCTOR WAFER

(75) Inventors: Satoshi Machida, Tokyo (JP); Takashi Taguchi, Tokyo (JP); Noboru Uchida, Tokyo (JP); Suguru Sasaki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/345,288

(22) Filed: Feb. 2, 2006

(65) Prior Publication Data

US 2006/0197237 A1    Sep. 7, 2006

(30) Foreign Application Priority Data

Mar. 4, 2005   (JP) .............................. 2005/059791

(51) Int. Cl.
*H01L 23/544* (2006.01)
(52) U.S. Cl. ...................... 257/797; 257/620
(58) Field of Classification Search ................ 257/620, 257/797; 438/401, 462
See application file for complete search history.

(56) References Cited

U.S. PATENT DOCUMENTS 4,230,505 A * 10/1980 Wu et al. .................... 438/380

5,877,094 A   3/1999 Egley et al.
6,975,040 B2 * 12/2005 Dower et al. ............... 257/797

FOREIGN PATENT DOCUMENTS

| JP | 05-198471 | 8/1993 |
|----|-----------|--------|
| JP | 07-283383 | 10/1995 |
| JP | 2000-098583 | 4/2000 |

* cited by examiner

*Primary Examiner*—Phat X. Cao
*Assistant Examiner*—Theresa T. Doan
(74) *Attorney, Agent, or Firm*—Volentine & Whitt, P.L.L.C.

(57) ABSTRACT

A semiconductor device comprises a semiconductor substrate having a first surface and a second surface, and a first multilayer laminated structure film which is formed in the first surface of the semiconductor substrate and has a first layer having a first refractive index, a second layer formed on the first layer and having a second refractive index lower than the first refractive index, and a third layer formed on the second layer and having a third refractive index higher than the second refractive index, and in which the thicknesses of the respective layers are respectively thicknesses calculated by $(2N+1)\lambda/(4n)$ where the wavelength of light used for detecting the first multilayer laminated structure film is defined as $\lambda$, the refractive indices of the respective layers are defined as n, and N is defined as 0 or a natural number.

9 Claims, 6 Drawing Sheets

SEMICONDUCTOR DEVICE AND SEMICONDUCTOR WAFER

FIELD OF THE INVENTION

The present invention relates to a semiconductor device, and particularly to a semiconductor device wherein the position detection or alignment of a semiconductor wafer is performed by an optical means in a manufacturing process.

BACKGROUND OF THE INVENTION

In the process of manufacturing a semiconductor integrated circuit (hereinafter called "LSI"), circuit elements are three-dimensionally formed on a substrate placed in a wafer state to fabricate a desired integrated circuit. In the semiconductor integrated circuit manufacturing process, a deposition process step for generating a film formed of a desired material, a lithography process step for effecting exposure/transfer of each circuit pattern on a polymer film (hereinafter called "resist") having reactivity to an exposure light beam, an etching process step for etch-processing a material film with the resist as a blocking film, a process step for implanting impurities, etc. are repeated a required number of times to thereby manufacture a desired integrated circuit.

A semiconductor device employed in the such process steps is provided with a detection mechanism which detects the presence or absence of the substrate and its orientation. For example, an optical transmission type wafer detection mechanism is equipped with a light emitting section and a light receiving or detecting section which detects light emitted from the light emitting section. The wafer detection mechanism detects the light outputted from the light emitting section through the light detecting section and determines the presence or absence of a wafer according to the intensity of light detected by the light detecting section. Since the light outputted from the light emitting section is directly detected by the light detecting section where the wafer is not placed on an optical path between the light emitting section and the light detecting section, for example, the value detected at the light detecting section is large and the wafer is hence judged not to exist. On the other hand, since the light that propagates from the light emitting section to the light detecting section is blocked by the wafer where the wafer is placed on the optical path between the light emitting section and the light detecting section, the value detected at the light detecting section is small and the wafer is hence judged to exist. In order to accurately detect the presence or absence of the wafer and its orientation by such an optical transmission type wafer detection mechanism, there is a need to increase the difference between the amounts of light transmitted through the wafer where the wafer is placed on the optical path between the light emitting section and the light detecting section and not placed thereon. It is thus desirable that when the wafer is placed on the optical path between the light emitting section and the light detecting section, the wafer perfectly blocks the light, or the amount of light transmitted through the wafer is reduced by reflecting, absorbing or scattering the light.

Upon the exposure in the lithography process step, an original plate in which each pattern is formed, using a material such as chromium, on a glass substrate having a cutoff property relative to the exposure light beam, is used as a mask. The mask's pattern is imaged onto a resist film on the wafer by an exposure device constituted of a scale-down projection optical system or the like to allow the resist to react. In the LSI manufacturing process of three-dimensionally forming the circuit elements, it is indispensable to align the position of each pattern on the mask with its corresponding circuit element already processed on the wafer in the previous process step. Overlay or registration marks formed on both the mask and the wafer are used upon the alignment. In the lithography process step, the amount of relative positional displacement between each formed resist pattern and the LSI element pattern already processed and formed in the previous process step is measured and the accuracy of superimposition or registration is confirmed, whereby process shipment is judged. A mark used at this time is an overlay or superimposition accuracy measurement mark (hereinafter called "registration measurement mark"). The registration mark and the superimposition mark are collectively called "alignment mark")

A wafer alignment method using reflection marks each composed of a multilayer reflection layer in respective scribe line areas in a wafer having a plurality of exposure regions surrounded by the scribe line areas has been described in Japanese Patent Laid-Open No. Hei 5(1993)-198471. Each of the reflection marks comprises a multilayer film reflection layer whose diameter is 0.1 mm and is equivalent to one wherein a molybdenum thin film having a thickness of 3.1 nm, and a silicon thin film having a thickness of 3.6 nm are respectively alternately laminated on one another by 20 layers and the top layer is covered with a molybdenum film of 3.1 nm. Allowing the reflection mark to reflect a soft X-ray whose incident angle is 0° and whose wavelength is 13 nm, with good efficiency enables high-precision positioning of the wafer.

Japanese Patent Laid-Open No. Hei 7(1995)-283383 describes an silicon-on-sapphire (SOS) wafer in which a polysilicon layer is formed on the back surface of the SOS wafer so as to reach a thickness enough to detect an opaque object by a photosensor, and dopant such as phosphorus is implanted in the polysilicon layer to allow the SOS wafer to have conductivity. Since the SOS wafer has the polysilicon layer having optical and electrical characteristics of silicon, the presence or absence of the wafer can be detected using an optical sensor and an electric sensor of a silicon wafer processing apparatus.

A phase shift mask which has enhanced reflectance of a second layer drawing alignment pattern, has been described in Japanese Patent Laid-Open No. 2000-98583. The phase shift mask is provided with a synthetic quartz substrate, and a light-shielding layer comprising a chromium layer and a low-reflection chromium layer sequentially formed on the surface of the synthetic quartz substrate. The chromium layer is grown on only the low-reflection chromium layer in the vicinity of the second layer drawing alignment pattern to bring the neighborhood of the second layer drawing alignment pattern into optical reflectivity, thereby making it possible to observe the second layer drawing alignment pattern in high contrast.

The wavelength of light used in the wafer detection mechanism and the observation of the alignment mark should be selected as a wavelength which does not give any obstacle to the LSI manufacture. For example, such a wavelength as not to expose a resist employed in the lithography process step to light should be selected. Since the resist is exposed with light of an i line 365 nm and a g line 436 nm each corresponding to the wavelength for a general high pressure mercury lamp, or light having a wavelength not greater than them, light having a wavelength longer than these wavelengths is used as an exposure light beam. For instance, light lying in a wavelength band of from over 500 nm to under 800 nm is used.

An SOS (Silicon on Sapphire) substrate employed in the manufacture of the semiconductor integrated circuit has little light absorption and has a reflectance of 65% or less in the wavelength band ranging from over 500 nm to under 800 nm, for example. Therefore, a first problem arises in that it is difficult to detect the presence or absence of the SOS substrate by a transmission type sensor. The LSI using the SOS wafer and the SOI wafer has a second problem in that when a thin silicon layer is thermally oxidized to form an alignment mark made up of a silicon oxide film, the recognition of the alignment mark becomes difficult.

The first problem will be explained. Spectral reflectances at a wavelength band ranging from 500 nm to 800 nm are calculated using a sapphire substrate of 600 μm and an SOS substrate in which a silicon layer is formed in the sapphire substrate with 110 μm. Thus, since the reflectance of the sapphire substrate is about 10% over the entire wavelength band and there is little absorption thereat, it has an optical transmittance of 90%. The SOS substrate indicates such a spectral characteristic that the peak of a reflectance of 60% is contained in a wavelength 580 nm. Since the SOS substrate has little light absorption either and light of approximately 40% or more is transmitted through the wafer at the wafer detection mechanism, there is a problem that the wafer detection mechanism lacks the reliability of wafer detection. This problem is because the SOS substrate comprises the sapphire substrate that allows light of 500 to 800 nm to pass therethrough, and the silicon layer thin to such an extent that it allows the light of 500 to 800 nm to pass therethrough. However, an SOI (Silicon on Insulator) substrate has a fear that as the thickness of the SOI substrate becomes thin, the accuracy of detection is degraded.

The second problem will be described in detail. In the SOS substrate, an alignment mark employed in a lithography process is formed in a device isolation process. In the device isolation process, each device region that actively operates as an LSI is separated using a LOCOS (Local oxidation of silicon) method that selectively oxidizes a silicon layer in general. However, upon separating the device region by the LOCOS method, the alignment mark is formed of a silicon oxide film. Since, however, the difference in reflectance between silicon and the silicon oxide film is small, the alignment mark of the silicon oxide film cannot be observed in high contrast. Since the degree of blackout at the edge of the alignment mark depends upon the scattering of light at its edge, it depends on a step between the silicon oxide film for the alignment mark and the silicon layer for the background. Since the silicon layers for the SOI substrate and the SOS substrate are thin, a step between the silicon oxide film and silicon layer formed by thermal oxidation is small as compared with a bulk silicon wafer. Therefore, the SOI substrate and the SOI substrate are also low in the degree of blackout at the mark edge and encounter difficulties in observing the edge of the mark.

According to Japanese Patent Laid-Open No. Hei 5(1993)-198471, the reflection mark is formed of the multilayer film obtained by respectively alternately laminating the molybdenum thin film having the thickness of 3.1 nm, and the silicon thin film having the thickness of 3.6 nm on one another, and the reflectance of the reflection mark relative to the soft X-ray whose wavelength is 13 nm is improved. However, there is a need to select the refractive indices of the respective films and their thicknesses to the optimum values and form the thicknesses in the form of a multilayer film in order to solve the first and second problems. However, Japanese Patent Laid-Open No. Hei 5(1993)-198471 does not refer to a method for selecting the refractive indices of the respective films and their thicknesses. Although the reflectance of the reflection mark relative to the soft X-ray having the wavelength of 13 nm has been described in the above publication, reflectance relative to light lying in each of wavelength bands other than it has not been described therein.

In the SOS wafer described in Japanese Patent Laid-Open No. Hei 7(1995)-283383, the polysilicon layer having conductivity and opacity is provided in the back surface of the SOS wafer to thereby improve reflectance at its back surface. However, the alignment mark cannot be formed on the silicon layer using the polysilicon layer.

In the phase shift mask described in Japanese Patent Laid-Open No. 2000-98583, the chromium layer high in reflectance is deposited in the vicinity of the second layer drawing alignment pattern to thereby enhance the reflectance. When, however, the phase shift mask is applied to the manufacture of the semiconductor device, the process step for evaporating the chromium layer is added, thereby causing the fear of increases in man-hour and cost.

Although the manufacture of either the alignment mark or the constitution for improving the reflectance of the semiconductor substrate has been described in the three documents referred to above, a method for manufacturing both with good efficiency is not described therein.

SUMMARY OF THE INVENTION

The present invention has been made in view of the foregoing problems. It is therefore an object of the present invention to increase reflectance of an alignment mark employed in a semiconductor device and reflectance of a semiconductor substrate employed therein.

According to one aspect of the present invention, for attaining the above object, there is provided a semiconductor device comprising:

a semiconductor substrate having a first surface and a second surface, the semiconductor substrate having a semiconductor layer including the first surface, and a sapphire substrate including the second surface;

a first multilayer laminated structure film formed in the first surface of the semiconductor substrate, the first multilayer laminated structure film having a first layer having a first refractive index, a second layer formed on the first layer and having a second refractive index lower than the first refractive index, and a third layer formed on the second layer and having a third refractive index higher than the second refractive index; and a second multilayer laminated structure film formed in the second surface of the semiconductor substrate, the second multilayer laminated structure film having a fourth layer having a fourth refractive index, a fifth layer formed on the fourth layer and having a fifth refractive index lower than the fourth refractive index, and a sixth layer formed on the fifth layer and having a sixth refractive index higher than the fifth refractive index.

In the semiconductor device according to the present invention, multilayer laminated structure films in each of which a low refractive-index layer is interposed between high refractive-index layers, are formed on the first and second surface sides of the semiconductor substrate. It is therefore possible to increase reflectance on each of the first and second surface sides of the semiconductor substrate. Since the respective layers each constituted of the same material and thickness are formed in both surfaces of the semiconductor substrate, the process of manufacturing each multilayer laminated structure film can be simplified. Thus, when a wafer containing the present semiconductor substrate is optically detected, detection light can sufficiently be blocked owing to the multilayer structure film high in reflectance. When the multilayer laminated structure film is processed into a predetermined pattern and the so-processed film is used as an alignment pattern, the alignment pattern can be observed satisfactorily without depending upon the thickness of the semiconductor layer.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described with reference to the accompanying drawings.

[Structure]

Figure 1A:
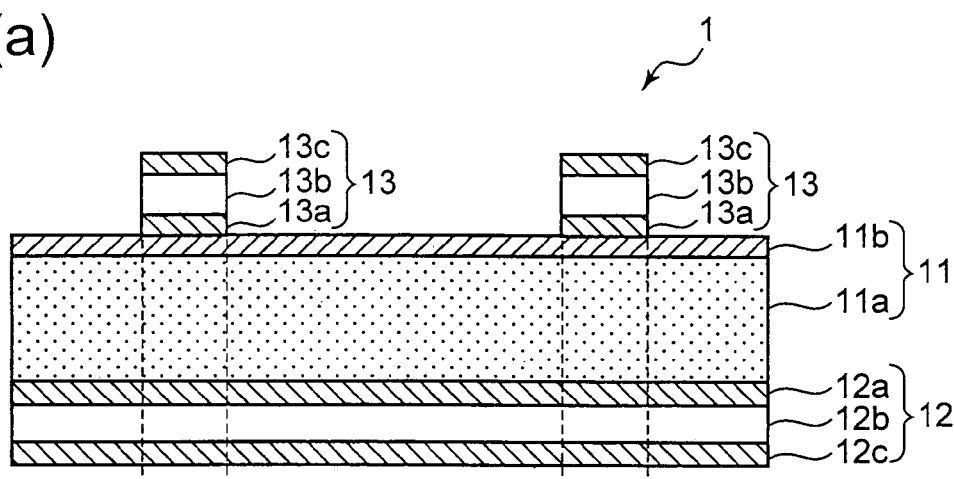
FIG. 1(a) is a sectional view of a semiconductor wafer according to one embodiment of the present invention and FIG. 1(b) is a plan view thereof.
Figure 1B:
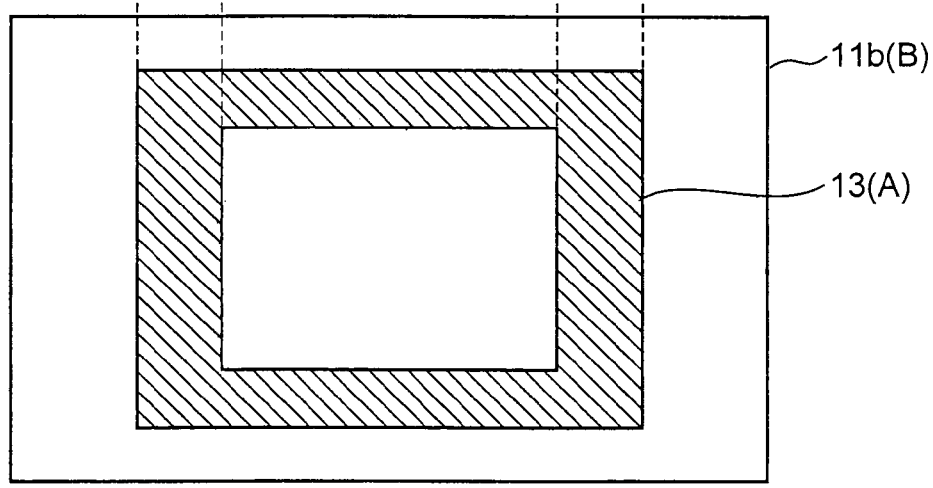

FIG. 1(a) is a sectional view of a semiconductor wafer 1 according to one embodiment of the present invention, and FIG. 1(b) is a plan view of the semiconductor wafer 1 at a position associated with the sectional view of FIG. 1, respectively.

The semiconductor wafer 1 includes an SOS (Silicon on Sapphire) substrate 11, a reflection mark 13 formed on one surface of the SOS substrate 11, and a reflection layer 12 formed on a surface of the SOS substrate 11, which is opposite to the surface on which the reflection mark 13 is formed.

As shown in FIG. 1(a), the SOS substrate 11 is provided with a sapphire substrate 11a used as a support substrate, and a silicon layer 11b formed on one surface of the sapphire substrate 11a.

The reflection mark 13 is a registration mark or a registration measurement mark (the registration mark and the registration measurement mark are collectively called "alignment mark") used as a positioning reference upon manufacturing circuit elements in plural layers including the silicon layer 11b. The reflection mark 13 includes a first layer 13a formed on the silicon layer 11b, a second layer 13b formed on the first layer 13a, and a third layer 13c formed on the second layer 13b. The first layer 13a through the third layer 13c are sequentially laminated over the silicon layer 11b by, for example, a CVD (Chemical Vapor Deposition) method. In the present embodiment, the reflection mark 13 is shaped in the form of a square as shown in FIG. 1(b). The shape of the reflection mark 13 is not limited to the square shape but may be another form whose outer shape is a round shape or the like.

Assuming that the refractive index of the first layer 13a is n1, the refractive index of the second layer 13b is n2, and the refractive index of the third layer 13c is n3, the respective refractive indices satisfy a relationship of n1>n2 and n2<n3. That is, the second layer 13b having the refractive index n2 is interposed between the first and third layer 13a and 13c respectively having the refractive indices n1 and n3 higher than the refractive index n2. Assuming that the thickness of the first layer 13a, the thickness of the second layer 13b, and the thickness of the third layer 13c are d1, d2, and d3 respectively, each of the thicknesses d1 through d3 is selected to such a thickness as to satisfy the following equation (1). In the equation (1), d indicates the thickness of each layer, N indicates 0 or a natural number, and n indicates the refractive index of each layer, respectively. λ indicates the wavelength of light employed in the detection (observation) of the reflection mark 13.

$$d = (2N+1)\frac{\lambda}{4n} \qquad (1)$$

The reflection mark 13 according to the present embodiment is configured in such a manner that the low refractive-index second layer 13b is interposed between the high refractive-index first and third layers 13a and 13c. Further, the thicknesses of the respective layers are selected so as to meet the equation (1). Thus, the reflectance of the reflection mark 13 is enhanced. By enhancing the reflectance of the reflection mark 13, the difference in reflectance between the reflection mark 13 and the silicon layer 11b corresponding to its background becomes large sufficiently. Thus, when the reflection mark 13 is observed in a bright field by means of an optical microscope or the like, the difference in reflectance between the reflection mark 13 and the silicon layer 11b of the background is large, and hence the reflection mark 13 can be observed in high contrast.

The reflection mark 13 is capable of sufficiently ensuring a step between the same and the silicon layer 11b corresponding to the background. When the silicon layer is thermally oxidized by the LOCOS method or the like to form the reflection mark using the silicon oxide film as in the prior art, the thickness of the silicon oxide film also becomes thin when the thickness of the silicon layer becomes thin, and the step between the silicon oxide film corresponding to the reflection mark and the silicon layer of the background becomes small. Thus, the degree of blackout at the edge of the reflection mark becomes low so the edge becomes unclear. On the other hand, since the reflection mark 13 employed in the present embodiment is formed by laminating the first layer 13a through the third layer 13c, regardless of the thickness of the silicon layer 11b, the step between the reflection mark 13 and the silicon layer 11b corresponding to the background can sufficiently be ensured by adjusting the thicknesses of the first layer 13a through the third layer 13c. Thus, since the step between the reflection mark 13 and the silicon layer 11b of the background is sufficiently ensured when the reflection mark 13 is observed in the bright field by the optical microscope or the like, light is sufficiently scattered at each edge of the reflection mark 13 to increase the degree of blackout at the edge, whereby the edge can sharply be observed.

The reflection mark 13 according to the present embodiment is configured so as to interpose the low refractive-index layer between the layers high in refractive index, and the thicknesses of the respective layers are respectively formed at such a thickness as to meet the equation 1 to enhance reflectance. Consequently, the ratio of contrast between the reflection mark 13 and the silicon layer 13b corresponding to the background is made high. Sufficiently ensuring the step between the reflection mark 13 and the silicon layer 13b corresponding to the background makes it possible to make clear each edge of the reflection mark 13. As a result, it becomes easy to recognize the reflection mark 13.

The reflection layer 12 is a reflection layer for increasing the reflectance of the semiconductor wafer 1 to decrease the amount of light transmitted through the semiconductor wafer 1, thereby enhancing the accuracy of detection of the semiconductor wafer 1 by an optical transmission type detection mechanism. The reflection layer 12 is of a multi-layer laminated structure film which includes a first layer 12a formed on the sapphire substrate 11a corresponding to the back surface of the SOS substrate 11, a second layer 12b formed on the first layer 12a, and a third layer 12c formed on the second layer 12b. The reflection layer 12 is formed over the entire surface of the sapphire substrate 11a. The first through third layers 12a through 12c are sequentially stacked on the sapphire substrate 11a by, for example, the CVD (Chemical Vapor Deposition) method.

Assuming that the refractive index of the first layer 12a is n1', the refractive index of the second layer 12b is n2', and the refractive index of the third layer 12c is n3', the respective refractive indices satisfy a relationship of n1'>n2' and n2'<n3'. That is, the second layer 12b having the refractive index n2' is interposed between the first and third layer 12a and 12c respectively having the refractive indices n1' and n3' higher than the refractive index n2'.

Assuming that the thickness of the first layer 12a, the thickness of the second layer 12b, and the thickness of the third layer 12c are d1', d2', and d3' respectively, each of the thicknesses d1' through d3' is selected to such a thickness as to satisfy the following equation (1) in a manner similar to the reflection mark 13. The refractive indices n1' through n3' of the layers 12a through 12c of the reflection layer 12 may be made identical to the refractive indices n1 through n3 of the layers 13a through 13c of the reflection mark 13 (i.e., n1=n1', n2=n2', and n3=n3').

The same material may be used for the first layer 13a of the reflection mark 13 and the first layer 12a of the reflection layer 12. The same material may be used for the second layer 13b of the reflection mark 13 and the second layer 12b of the reflection layer 12. The same material may be used for the third layer 13c of the reflection mark 13 and the third layer 12c of the reflection layer 12. Since the reflection mark 13 and the reflection layer 12 can be formed using the same material in this case, they are easy to manufacture. Further, if the thicknesses d1' through d3' of the respective layers 12a through 12c of the reflection layer 12 are made identical to the thicknesses d1 through d3 of the respective layers 13a through 13c of the reflection mark 13, then a manufacturing process becomes easier.

An optical transmission type wafer detection mechanism mounted in a semiconductor manufacturing apparatus, such as an exposure device includes a light emitting section and a light receiving or detecting section. The light detecting section detects light emitted from the light emitting section and makes a decision as to the presence or absence of the semiconductor wafer 1 according to the intensity of its detection. In the semiconductor manufacturing apparatus, the semiconductor wafer 1 is disposed on an optical path between the light emitting section and the light detecting section in such a manner that the light emitted from the light emitting section is launched from the reflection layer 12 side to the semiconductor wafer 1. When the semiconductor wafer 1 is placed on the optical path, the optical transmission type wafer detection mechanism judges the semiconductor wafer 1 to be placed in a predetermined position. When the semiconductor wafer 1 is not placed on the optical path, the optical transmission type wafer detection mechanism determines that no semiconductor wafer 1 exists. The wafer detection mechanism detects the presence or absence of the semiconductor wafer 1 using the difference between the intensities detected by the light detecting section where the semiconductor wafer 1 is placed on the optical path between the light emitting section and the light detecting section, and the semiconductor wafer 1 is not placed thereon. In the present embodiment, the second layer 12b is interposed between the first layer 12a and the third layer 12c each higher than the second layer 12b in refractive index, and the thickness of each layer is selected so as to satisfy the equation (1), in a manner similar to the reflection mark 13 referred to above, thereby enhancing the reflectance of the reflection layer 12. Thus, when the semiconductor wafer 1 is placed on the optical path between the light emitting section and the light detecting section of the wafer detection mechanism, the reflectance of light is high at the reflection layer 12 and hence the amount of light transmitted through the semiconductor wafer 1 becomes small, thus making it possible to reduce the intensity of detection by the light detecting section where the semiconductor wafer 1 is placed on the optical path. As a result, the accuracy of detection of the semiconductor wafer 1 can be enhanced by increasing the difference between the detected intensities where the semiconductor wafer 1 is placed on the optical path and not placed thereon.

[Reflectance by Multilayer Laminated Structure Film]

Explanations will be made on the reason that the layer low in refractive index is interposed between the layers high in refractive index, and the thicknesses of the respective layers are selected according to the equation (1), whereby the reflectances of the reflection mark 13 and the reflection layer 12 can be enhanced.

Let's first consider where a first layer having a refractive index n is formed on a substrate having a refractive index ns, and light is launched from in the air having a refractive index n0. If this is brought into correspondence with FIG. 1, then the above case results in a case in which only the first layer 13a is formed on the silicon layer 11b having the refractive index ns, and light is launched from in the air of the refractive index n0.

Assuming that an electric field vector is E1 and a magnetic field vector is H1, the relation of the following equation (2) is established between an amplitude vector (E1, H1) of a film surface of the first layer, which is brought into contact with the air from the energy conservation side, and an amplitude vector (E2, H2) of a film surface of the substrate, which is brought into contact with the surface of the first layer (refer to, for example, Optical Introduction II by Junpei Tsujiuchi).

$$\begin{bmatrix} E_1 \\ H_1 \end{bmatrix} = \begin{bmatrix} \cos k\Delta & -i\sin k\Delta/p \\ -ip\sin k\Delta & \cos k\Delta \end{bmatrix} \begin{bmatrix} E_2 \\ H_2 \end{bmatrix} = [M_1] \begin{bmatrix} E_2 \\ H_2 \end{bmatrix} \quad (2)$$

A matrix M in the equation (2) is called "characteristic matrix", and $k\Delta$ indicates the difference in phase between the amplitude vectors (E1, H1) and (E2, H2). Let's consider in the present embodiment where light is launched into the first layer to allow the light to vertically fall on the semiconductor wafer upon observation of the reflection mark and detection of the semiconductor wafer. When the light is vertically launched into the semiconductor wafer, p is expressed like the following equation (3) without depending on S and p components of polarized light. In the equation, $\epsilon 0$ indicates a dielectric constant of vacuum, and $\mu 0$ indicates permeability of vacuum.

$$p = \sqrt{\frac{\varepsilon_0}{\mu_0}} n \quad (3)$$

If a second layer having a refractive index n2 is formed on the first layer, then an amplitude vector (E3, H3) of a film surface of the second layer, which contacts the air, is expressed as follows:

$$\begin{bmatrix} E_2 \\ H_2 \end{bmatrix} = [M_2] \begin{bmatrix} E_3 \\ H_3 \end{bmatrix} \quad (4)$$

If such a layer is laminated by x layers (where x: natural number), then amplitude vectors at the film surface of the first layer and a film surface of an xth layer are expressed in the following equation (5). A characteristic matrix of a multilayer laminated structure film in the equation (5) can be arranged as given by the following equation (6). An amplitude reflection coefficient r of the whole multilayer laminated structure film obtained by laminating the first to xth layers is given by the following equation (7), and its reflectance R is expressed like the following equation (8).

$$\begin{bmatrix} E_1 \\ H_1 \end{bmatrix} = [M_1][M_2] \wedge [M_x] \begin{bmatrix} E_{x+1} \\ H_{x+1} \end{bmatrix} \quad (5)$$

where x is a natural number greater than or equal to 3.

$$[M] = [M_1][M_2] \wedge [M_x] = \begin{bmatrix} m_{11} & m_{12} \\ m_{21} & m_{22} \end{bmatrix} \quad (6)$$

$$r = \frac{pm_{11} + p^2 m_{12} - m_{21} - pm_{22}}{pm_{11} + p^2 m_{12} + m_{21} + pm_{22}} \quad (7)$$

$$R = |r|^2 = \left| \frac{pm_{11} + p^2 m_{12} - m_{21} - pm_{22}}{pm_{11} + p^2 m_{12} + m_{21} + pm_{22}} \right|^2 \quad (8)$$

If only the first layer having the refractive index n is formed on the substrate having the refractive index ns and light is vertically launched into the first layer, then reflectance R is expressed in the following equation (9). Next, when the equation (9) is differentiated to determine extreme values, R has extreme values where $\sin k\Delta=0$ and $\cos k\Delta=0$, and their $k\Delta$ are represented as $k\Delta=N\pi$ and $k\Delta=(2N+1)\pi/2$ (where N: 0 or natural number) respectively.

$$R = \frac{n^2(n_0 - n_s)^2 \cos^2 k\Delta + (n_0 n_s - n^2)^2 \sin^2 k\Delta}{n^2(n_0 + n_s)^2 \cos^2 k\Delta + (n_0 n_s + n^2)^2 \sin^2 k\Delta} \quad (9)$$

When $k=N\pi$, the reflectance is represented as given by the following equation (10), and it is not used because the characteristic of the first layer is not concerted therein at all. On the other hand, $k\Delta=(2N+1)\pi/2$, the reflectance is represented as given by the following equation (11), and the reflectance R changes according to the characteristic of the first layer. Since $k\Delta=(2N+1)\pi/2=2\pi nd/\lambda$ to satisfy $k\Delta=(2N+1)\pi/2$ if the wavelength of light is assumed to be $\lambda$, the thickness d of the first layer is given as expressed in the equation (1).

$$R = \left[ \frac{n_0 - n_s}{n_0 + n_s} \right]^2 \quad (10)$$

$$R = \left[ \frac{n_0 n_s - n^2}{n_0 n_s + n^2} \right]^2 \quad (11)$$

The equation (11) means that a layer composed of a material having a refractive index higher than the refractive indices of the air (n0) and the substrate (ns) is formed with a thickness according to the equation (1), whereby the reflectance of the entire multilayer laminated structure film can be increased.

Now consider similarly where such a layer is laminated in the form of three layers. Assuming that the refractive index of the first layer is n1, the refractive index of the second layer is n2, and the refractive index of the third layer is n3, reflectance R is represented as given by the following equation (12):

$$R = \left[ \frac{n_0 n_s n_2^2 - n_1^2 n_3^2}{n_0 n_s n_2^2 + n_1^2 n_3^2} \right]^2 \quad (12)$$

The equation (12) indicates that a material (high refractive-index material: H layer) high in refractive index is used for each of the first and third layers, and a material (low refractive-index material: L layer) low in refractive index is used for the second layer, and such a structure (H-L-H) that the low refractive-index material is interposed between the high refractive-index materials is formed and the thicknesses of the respective layers are selected so as to satisfy the equation (1), whereby the refractive index can be increased as compared with the single layer indicated by the equation (11). Further, the reflectance can be increased by repeatedly laminating such a multilayer laminated structure film.

It is understood from above that the second layer 13b is interposed between the first layer 13a and the third layer 13c each having the refractive index higher than that of the second layer 13b as in the reflection mark 13 employed in the present embodiment, and the thicknesses of the respective layers are selected so as to satisfy the equation 1, thereby making it possible to increase the reflectance of the reflection mark 13. It is also understood that the second layer 12b is interposed between the first layer 12a and the third layer 12c each having the refractive index higher than that of the second layer 12b as in the reflection layer 12 employed in the present embodiment, and the thicknesses of the respective layers are selected so as to satisfy the equation (1), thereby making it possible to increase the reflectance of the reflection layer 12. It is understood that as such a structure that the layer lower in refractive index is interposed between the layers higher in refractive index is repeatedly laminated, the reflectances of the reflection mark 13 and the reflection layer 12 can be increased.

[Operation and Effects]

According to the reflection mark 13 of the present embodiment, the second layer is interposed between the first and third layers each having the refractive index higher than that of the second layer, and the thicknesses of the layers are selected so as to satisfy the equation (1), thereby making it possible to increase the reflectances of the reflection mark 13 and the reflection layer 12. This is particularly effective for the case in which it is necessary to form a reflection mark (alignment mark) on an SOS substrate and a silicon layer thin like an SOI substrate. A problem arises in that when a reflection mark is formed on the thin silicon layer by thermal oxidation, the difference in reflectance between a silicon oxide film and its corresponding silicon layer is small and the oxidized silicon layer is thin, so that a step between the silicon oxide film and the silicon layer cannot sufficiently be ensured. According to the reflection mark based on the multilayer laminated structure film according to the present embodiment, however, the reflectance of the reflection mark is enhanced to make it possible to increase the difference in reflectance between the reflection mark and the silicon layer, and the thickness of the multilayer laminated structure film is adjusted to thereby make it possible to sufficiently ensure a step between the reflection mark and the silicon layer. Thus, the increase in the difference in reflectance between the reflection mark and the silicon layer enables observation of the reflection mark in high contrast with respect to the silicon layer of the background. With an increase in the step between the reflection mark and the silicon layer, the degree of blackout at each edge of the reflection mark becomes large so that the edge can be observed sharply. As a result, the accuracy of registration by each alignment mark can be enhanced. When the amount of relative position displacement between a resist pattern and an LSI element pattern already processed and formed in the previous process is measured by a registration measurement mark, its measurement becomes easy.

According to the reflection layer 12 according to the present embodiment, the second layer is interposed between the first layer and the third layer each having the refractive index higher than that of the second layer, and the thicknesses of the respective layers are selected so as to satisfy the equation (1), whereby the reflectance of the reflection layer 12 can be increased. Thus, when the semiconductor wafer 1 is placed on the optical path between the light emitting section and light detecting section of the wafer detection mechanism, the amount of light transmitted through the semiconductor wafer 1 can be reduced. When the semiconductor wafer 1 is placed on the optical path, the intensity of detection at the light detecting section can be reduced. As a result, the accuracy of detection of the semiconductor wafer 1 can be enhanced by increasing the difference between the detected intensities where the semiconductor wafer 1 is placed on the optical path and not placed thereon.

Incidentally, although the above embodiment has explained the case in which each of the SOS substrate and the SOI substrate is used as the semiconductor substrate, a bulk silicon substrate may be used. Even when the reflection mark 13 according to the present embodiment is formed in the bulk silicon substrate, the difference in reflectance between the reflection mark and the background can be increased as compared with the case in which the reflection mark of the silicon oxide film is formed on the silicon layer. Even when the reflection layer 12 according to the present embodiment is formed in the bulk silicon substrate, the accuracy of detection can be enhanced by reducing the amount of light transmitted through the semiconductor wafer upon detecting the semiconductor wafer by the optical transmission type detection mechanism.

The reflection mark 13 and the reflection layer 12 are also capable of repeating use such a structure as to satisfy the condition that the thickness of each layer is selected according to the equation (1), and that a layer lower in refractive index is interposed between layers higher in refractive index. In the reflection mark 13 and the reflection layer 12, for example, a laminated structure film composed of second and third layers can be laminated one or more over the corresponding first, second and third layers. As the number of layers for the reflection mark 13 and the reflection layer 12 increases, the reflectance can be made high. Thus, the number of the layers for the reflection mark 13 and the reflection layer 12 may be selected so as to satisfy reflectance required for the observation of the reflection mark 13 and the detection of the semiconductor wafer 1.

Figure 6:
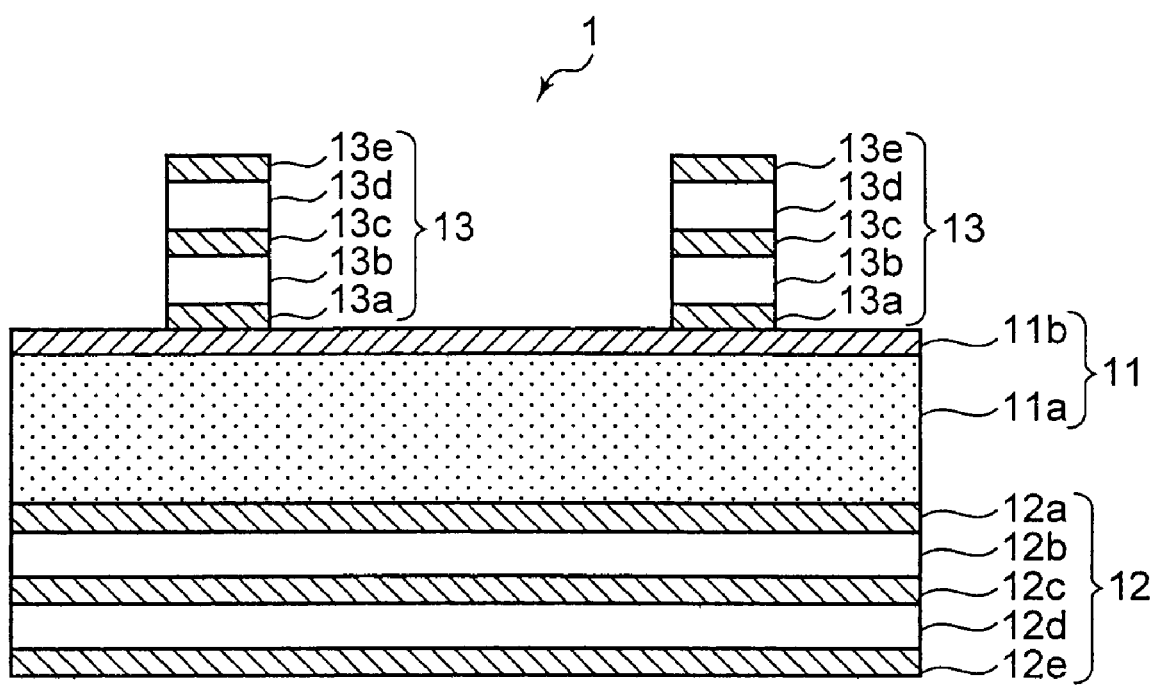
FIG. 6 is a sectional view of a semiconductor wafer according to a modification of the one embodiment of the present invention.

FIG. 6 is a semiconductor wafer 1 where a reflection mark 13 and a reflection layer 12 are respectively formed in the form of five layers. Here, the reflection mark 13 and the reflection layer 12 are respectively formed of the five layers. The reflection mark 13 includes a fourth layer 13d formed on a third layer 13c, and a fifth layer 13e formed on the fourth layer 13d. The fourth layer 13d has the same refractive index and thickness as a second layer 13b, and the fifth layer 13e has the same refractive index and thickness as the third layer 13c. If the refractive indices of the third and fifth layers 13c and 13e are higher than the refractive index of the fourth layer 13d, and the thicknesses of the fourth layer 13d and the fifth layer 13e are selected so as to satisfy the equation (1), then the fourth layer 13d and the fifth layer 13e may not be the same refractive index and thickness as the second layer 13b and the third layer 13c respectively.

The number of layers for the reflection mark 13 and the number of layers for the reflection layer 12 may be different from each other. That is, the layer number for the reflection mark 13 and the layer number for the reflection layer 12 can be selected independently in such a manner that the reflection mark 13 is set to such a degree that it can be observed sharply upon its observation in a bright field, and the reflection layer 12 is set to such a degree that the semiconductor wafer 1 can be detected satisfactorily. Particularly when light wavelength bands used in the observation of the reflection mark 13 and the detection of the semiconductor wafer 1 differ, the reflection mark 13 and the reflection layer 12 are formed in such a manner that the layer number for the reflection mark 13 and the layer number for the reflection layer 12 become different, thereby making it possible to obtain reflectances of the reflection mark 13 and the reflection layer 12 most suitable for the observation of the reflection mark 13 and the detection of the semiconductor wafer 1.

[Specific Examples of Reflection Mark and Reflection Layer]

Specific configurational examples of the reflection mark 13 and reflection layer 12 described above will be explained.

In the reflection mark 13, each of a first layer 13a and a third layer 13c can be formed of a polycrystalline silicon layer having a refractive index of 3.8, and a second layer 13b can be formed of a silicon oxide film having a refractive index of 1.46. In this case, n1=n3=3.8, and n2=1.46, and they satisfy a condition (condition under which a layer low in refractive index is interposed between layers high in refractive index) of n1>n2 and n2<n3. The thicknesses of the polycrystalline silicon layer 13a, the silicon oxide film 13b and the polycrystalline silicon layer 13c can be determined according to the equation (1) respectively. Assuming that the wavelength of light employed in the detection of the reflection mark 13 or the detection of the semiconductor wafer 1 is 640 nm and N=0 in the equation (1), the first layer 13a through the third layer 13c can respectively be determined as follows:

$$d1=d3=(2*0+1)*640*10^{-9}/(4*3.8)=42 \text{ nm}$$

$$d2=(2*0+1)*640*10^{-9}/(4*1.46)=110 \text{ nm}$$

Thus, the reflection mark 13 can be formed by the polycrystalline silicon layer 13a of which the refractive index n1=3.8 and the thickness d1=42 nm, the silicon oxide film 13b of which the refractive index n2=1.46 and the thickness d2=110 nm, and the polycrystalline silicon layer 13c of which the refractive index n3=3.8 and the thickness d3=42 nm.

A first layer 12a through a third layer 12c of the reflection layer 12 can also be formed in a manner similar to the reflection mark 13. That is, the reflection layer 12 can be formed by a polycrystalline silicon layer 12a whose refractive index n1'=3.8 and thickness d1'=42 nm, a silicon oxide film 12b whose refractive index n2'=1.46 and thickness d2'=110 nm, and a polycrystalline silicon layer 12c whose refractive index n3'=3.8 and thickness d3'=42 nm.

The respective thicknesses are determined from the equation (1) with N=0 in consideration of the fact that as N becomes low-order in the equation (1), the reflection layer results in a characteristic less reduced in reflectance variation in the neighborhood of a wavelength λ of light. If such a range that the variation in reflectance in the vicinity of the wavelength λ of the light is allowable is taken upon measurement of the reflection mark and/or detection of the semiconductor wafer 1, N is then set to greater than or equal to 1 and each thickness may be determined.

[Manufacturing Method]

A method for manufacturing the semiconductor wafer according to the present embodiment will be described below with reference to FIGS. 2 and 3. A description will be made here, by way of example, of the case in which the reflection mark 13 and the reflection layer 12 each constituted of the 3-layer laminated structure film of the polycrystalline layer, silicon oxide film and polycrystalline silicon layer described in the [Reflection Mark and Specific Example of Reflection Layer].

FIGS. 2 and 3 are sectional views for describing the method for manufacturing the semiconductor wafer 1 according to the present embodiment.

Figure 2A:
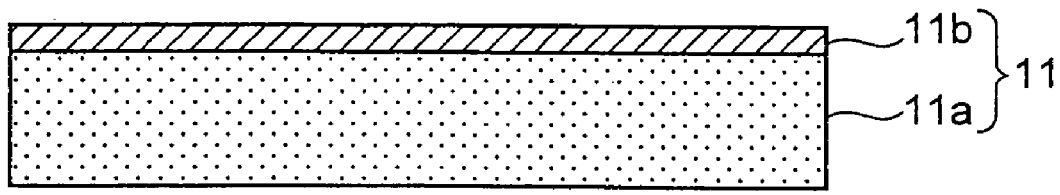
FIG. 2 is a manufacturing process view of the semiconductor wafer according to the one embodiment of the present invention.

As shown in FIG. 2(a), an SOS wafer 11 formed with a silicon layer 11b having a thickness of 110 nm on the surface of a sapphire substrate 11a of 600 μm is first prepared with the sapphire substrate 11a as a support substrate.

Figure 2B:
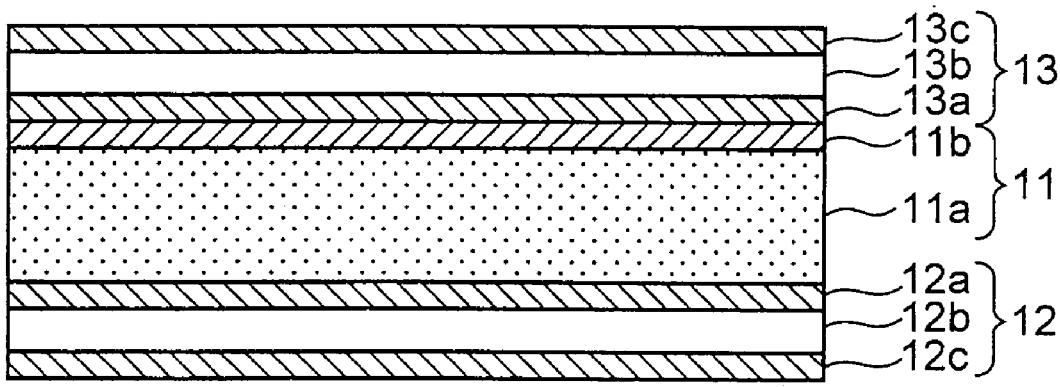

Next, as shown in FIG. 2(b), a polycrystalline silicon layer 13a, a silicon oxide film 13b, and a polycrystalline silicon layer 13c are sequentially laminated over the surface of the silicon layer 11b, corresponding to the surface of the SOS wafer 11 by a CVD (Chemical Vapor Deposition) method. Polycrystalline silicon 12a, a silicon oxide film 12b, and polycrystalline silicon 12c are sequentially stacked over the surface of the sapphire substrate 11a, corresponding to the back surface of the SOS wafer 11. Specifically, using a CVD method, a polycrystalline silicon layer 13a having a thickness of 42 nm is first formed on the silicon layer 11b, and polycrystalline silicon or the like 12a having a thickness of 42 nm is formed on the sapphire substrate 11a. Next, a silicon oxide film 13b having a thickness of 110 nm is formed on the polycrystalline silicon layer 13a and a silicon oxide film 12b having a thickness of 110 nm is formed on the polycrystalline silicon layer 12a, using the CVD method. Further, using the CVD method, a polycrystalline silicon layer 13c having a thickness of 42 nm is formed on the silicon oxide film 13b, and polycrystalline silicon 12c having a thickness of 42 nm is formed on the silicon oxide film 12b. According to this process, a reflection layer 12 made up of the polycrystalline silicon layer 12a, silicon oxide film 12b and polycrystalline silicon 12c is formed. The polycrystalline silicon layer 13a, silicon oxide film 13b and polycrystalline silicon layer 13c are processed into such a shape as shown in FIG. 1(b) in a subsequent process to reach a reflection mark 13. A CVD condition for the polycrystalline silicon 13a and 13c and the polycrystalline silicon 12a and 12c is that, for example, $SiH_4$ gas is introduced at a flow rate of 100 to 250 cm$^3$/min., in-chamber pressure ranges from 0.10 Torr to 0.40 Torr, and an in-chamber temperature ranges from 600° C. to 630° C. A CVD condition for the silicon oxide films 13b and 12c is that, for example, TEOS (tetraethoxylane gas) is introduced at a flow rate of 100 to 300 cm$^3$/min., in-chamber pressure ranges from 0.20 Torr to 0.60 Torr, and an in-chamber temperature ranges from 680° C. to 720° C.

As described above, the thicknesses of the polycrystalline silicon layer 13a, the silicon oxide film 13b and the polycrystalline silicon layer 13c, and the thicknesses of the polycrystalline silicon 12a, the silicon oxide film 12b and the polycrystalline silicon 12c are respectively formed with 42 nm, 110 nm and 42 nm in such a manner that the respective thicknesses satisfy the equation (1).

Figure 2C:
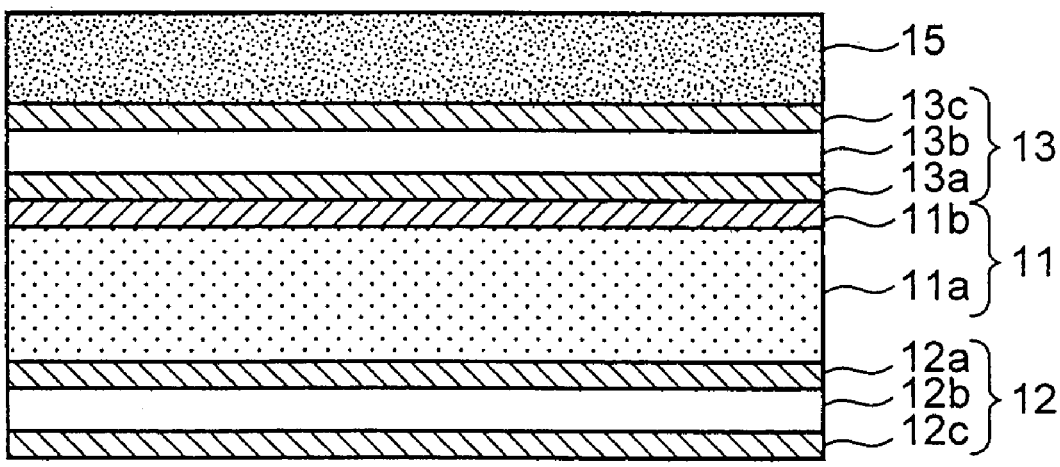
Figure 3A:
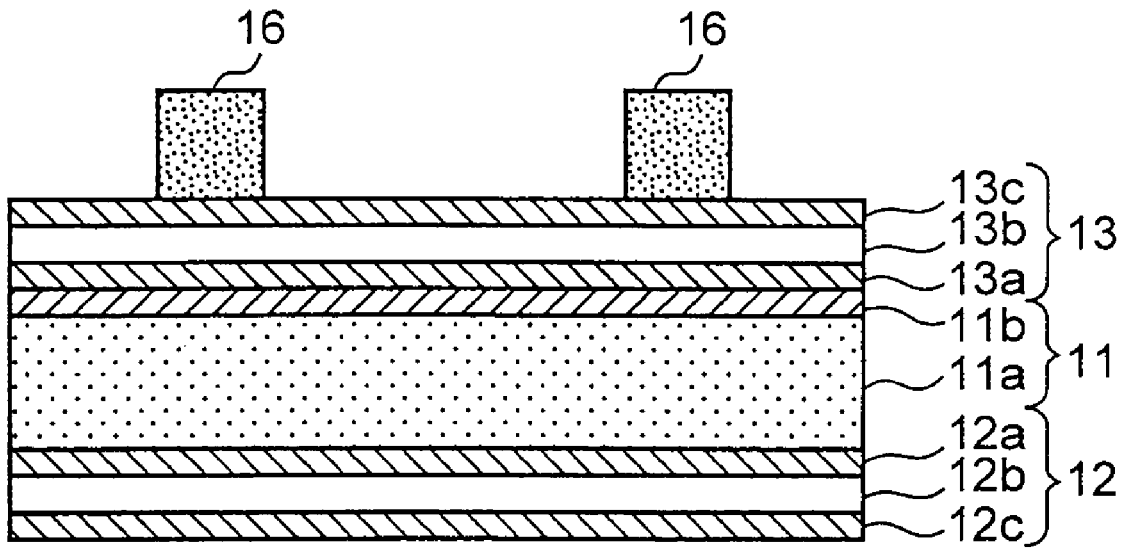
FIG. 3 is a manufacturing process view of the semiconductor wafer according to the one embodiment of the present invention.

Next, as shown in FIG. 2(c), a resist film 15 is formed on the polycrystalline silicon layer 13 so as to range from approximately 400 nm to 1000 nm. Thereafter, as shown in FIG. 3(a), a resist pattern 16 corresponding to the shape of the reflection mark 13 is formed by photolithography.

Figure 3B:
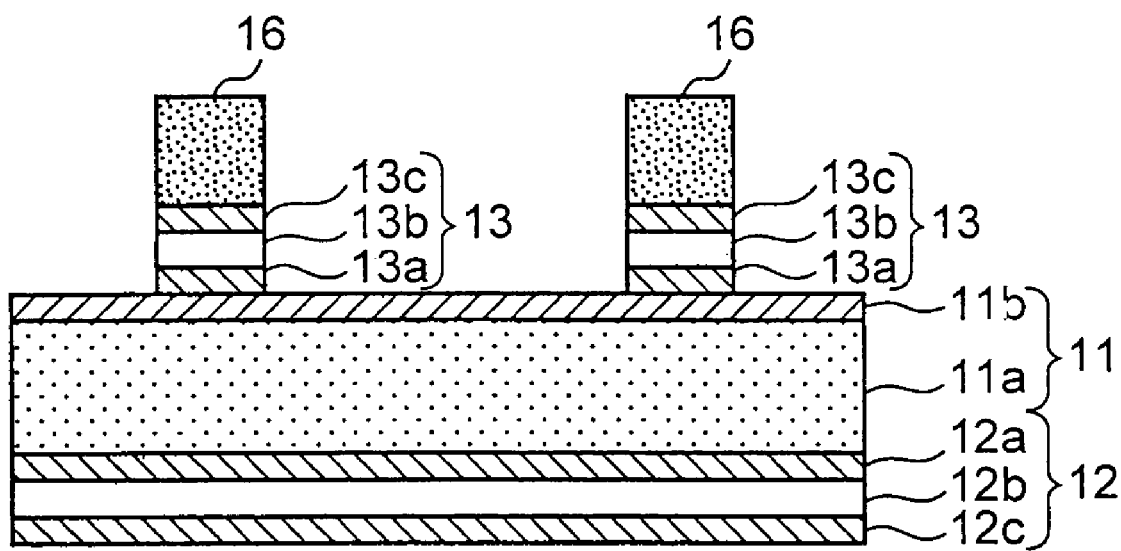

Next, as shown in FIG. 3(b), the polycrystalline silicon layer 13c, the silicon oxide film 13b and the polycrystalline silicon layer 13a are etched by an etching process with the resist pattern 16 as a mask. An etching condition for the respective polycrystalline silicon 13a and 13c and the respective polycrystalline silicon 12a and 12c is that, for example, an $HBr/O_2$ mixed gas is used, in-chamber pressure ranges from 5 mTorr to 15 mTorr, plasma generation power (RF power) is 250 W, and ion energy control power (bias RF power) is 30 W. An etching condition for the silicon oxide films 13b and 12c is that a $CF_4/CH_2F_2$/He mixed gas is used, in-chamber pressure ranges from 5 mTorr to 15 mTorr, plasma generation power (RF power) is 900 W, and ion energy control power (bias RF power) is 80 W.

Next, the resist pattern 16 is removed and the semiconductor wafer 1 shown in FIG. 1 is formed. Circuit elements each having a multilayer structure are formed in the silicon layer 11b corresponding to the side of the semiconductor wafer 1 where the reflection mark 13 is formed in a subsequent process, and above the silicon layer 11b, whereby a semiconductor device is completed.

According to the manufacturing method according to the present embodiment, the reflection layer 12 which reduces the transmitted amount of light at the detection of the semiconductor wafer, and the reflection mark 13 corresponding to the alignment mark formed in the first layer of the semiconductor wafer 1 can be manufactured simultaneously. It is therefore possible to simplify the manufacturing process of the semiconductor device.

[Results of Experiment]

Figure 4A:
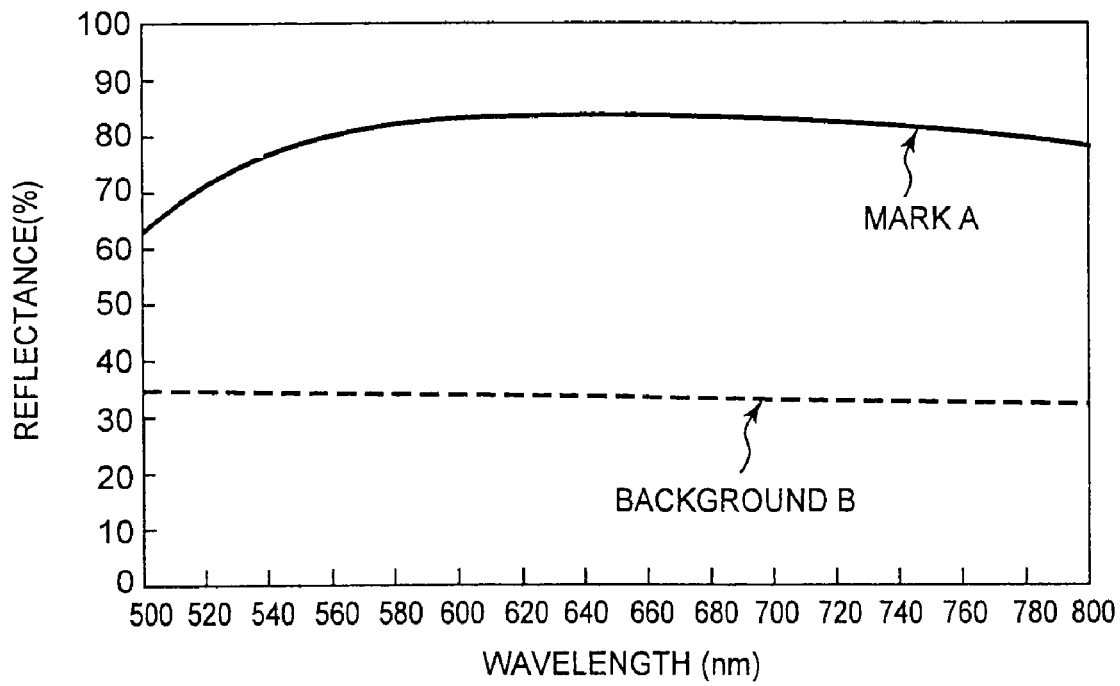
FIG. 4 shows results of calculations of spectral reflectances of reflection marks and backgrounds between the semiconductor wafer according to the one embodiment of the present invention and a conventional semiconductor wafer.
Figure 4B:
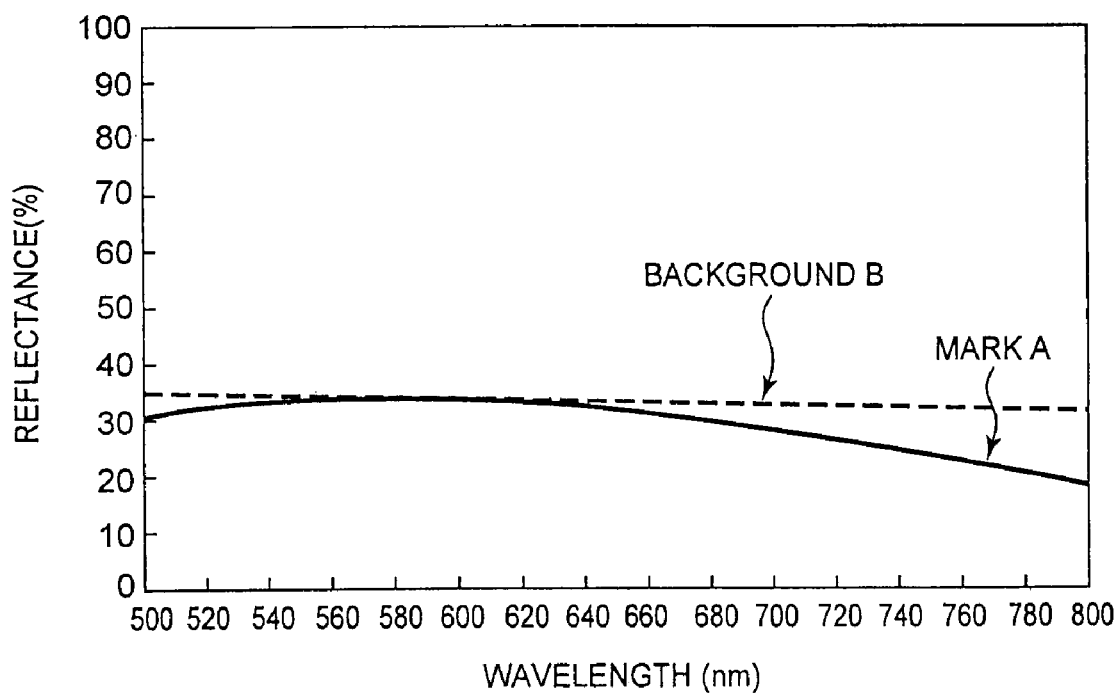

FIG. 4(a) shows a result of calculations of spectral reflectances of approximately 500 to 800 nm corresponding to a wavelength band of visible light with respect to a reflection mark 13(A) and the silicon layer 11b corresponding to a background (B) where the thickness of each polycrystalline silicon layer and the thickness of the silicon oxide film are respectively formed with 42 nm and 110 nm in the above manufacturing process. FIG. 4(b) shows a result of calculations of spectral reflectances of a conventional reflection mark (A) composed of a silicon oxide film, and a silicon layer of a background (B) by a LOCOS method.

Figure 5A:
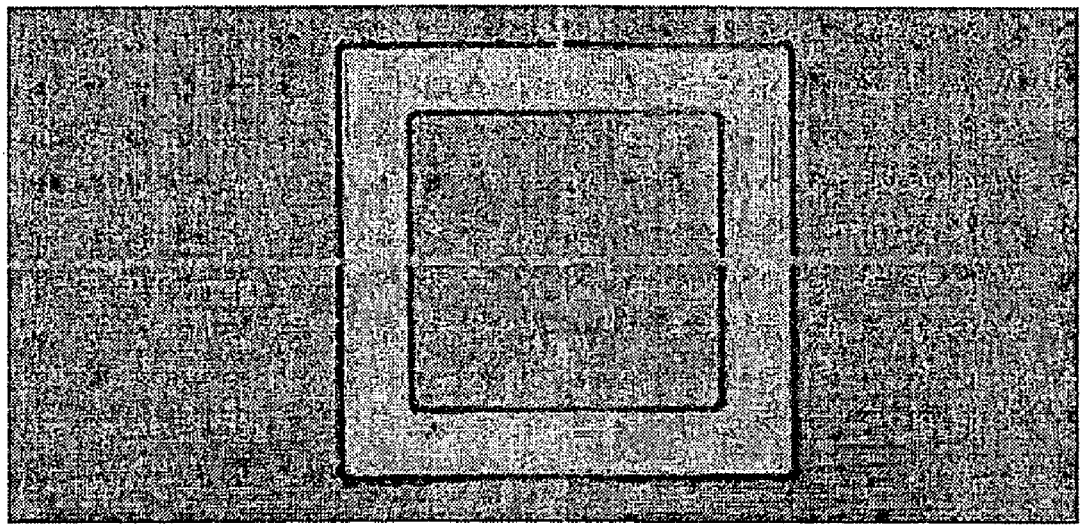
FIG. 5 shows mark images obtained by observing reflection marks in a bright field in the semiconductor wafer according to the one embodiment of the present invention and the conventional semiconductor wafer.
Figure 5B:
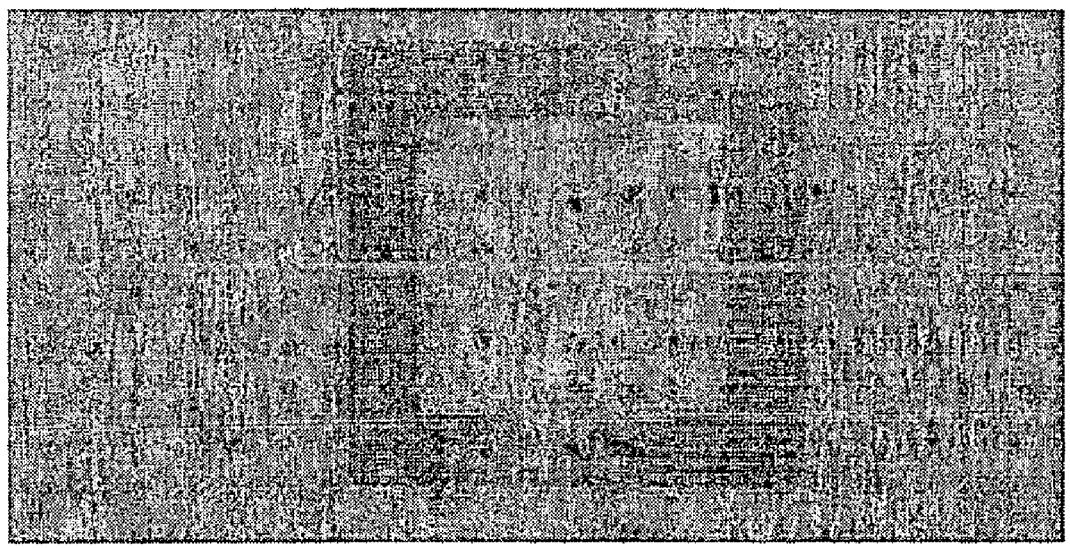

FIG. 5(a) shows a result obtained by actually observing a reflection mark 13(A) in a bright field in a state in which a silicon oxide film of 900 nm is formed directly on the reflection mark 13(A) where the thickness of each polycrystalline silicon layer and the thickness of the silicon oxide film are respectively formed with 42 nm and 110 nm in the above manufacturing process. FIG. 5(b) shows a result obtained by actually observing a reflection mark (A) in a bright field where a silicon oxide film of 900 nm is formed directly on the conventional reflection mark (A) made up of a silicon oxide film by a LOCOS method.

Incidentally, the conventional reflection mark (A) was formed on the same substrate as the SOS substrate 11 used in the manufacturing method of the present embodiment.

As shown in FIG. 4(b), there is little difference between the reflectance of the conventional reflection mark A (silicon oxide film portion) by the LOCOS method and the reflectance of the background B (silicon portion) in the wavelength band ranging from 500 nm to 800 nm. As a result, as shown in FIG. 5(b), a mark image at the time that the reflection mark A (silicon oxide film portion) is observed in the bright field is low in contrast relative to the background. Since the thin silicon layer of 110 nm is thermally oxidized to form the reflection mark A constituted of the silicon oxide film, a step between the silicon oxide film for the reflection mark A and the silicon layer for the background B is small and the edge of the reflection mark A is unclear.

In contrast, as shown in FIG. 4(a), the reflectance of the reflection mark 13 comprised of the 3-layer laminated structure film according to the present embodiment is sufficiently larger than that of the silicon layer 11b of the background in the wavelength band ranging from 500 nm to 800 nm, and the difference between the reflectance of the reflection mark 13 and the reflectance of the background B is large. As a result, the contrast of the reflection mark 13 relative to the background B is high as shown in FIG. 5(a). Since the reflection mark 13 is configured by laminating the polycrystalline silicon 13a of 42 nm, the silicon oxide film 13b of 110 nm and the polycrystalline silicon 13c of 42 nm on the silicon layer 11b, a step of 194 nm occurs in the edge of the reflection mark 13. Therefore, the degree of blackout at the edge is high and the distinct edge can be observed.

Since the reflection layer 12 according to the present embodiment is also the same structure as the reflection mark 13, the reflectance of the reflection layer 12 also indicates a reflectance of 75% or more in the wavelength band ranging from 500 nm to 800 nm in a manner similar to FIG. 4(a). Thus, when light is launched from the reflection layer 12 side by using the optical transmission type wafer detection mechanism, the light is reflected at the reflection layer 12 in high reflectance, so that the light transmitted through the semiconductor wafer 1 can sufficiently be reduced. Thus, when the semiconductor wafer 1 is detected by the optical transmission type detection mechanism, the difference between the intensities detected at the light detecting section where the semiconductor wafer 1 is placed on the optical path between the light emitting section and the light detecting section and not placed thereon becomes large, and hence the accuracy of detection of the semiconductor wafer 1 is enhanced.

While the preferred forms of the present invention have been described, it is to be understood that modifications will be apparent to those skilled in the art without departing from the spirit of the invention. The scope of the invention is to be determined solely by the following claims.

What is claimed is:

1. A semiconductor device comprising:
   a semiconductor substrate having a first surface and a second surface, said semiconductor substrate having a semiconductor layer including the first surface, and a sapphire substrate including the second surface;
   a first multilayer laminated structure film formed in the first surface of said semiconductor substrate, said first multilayer laminated structure film having a first layer having a first refractive index, a second layer formed on the first layer and having a second refractive index lower than the first refractive index, and a third layer formed on the second layer and having a third refractive index higher than the second refractive index; and
   a second multilayer laminated structure film formed in the second surface of said semiconductor substrate, said second multilayer laminated structure film having a fourth layer having a fourth refractive index, a fifth layer formed on the fourth layer and having a fifth refractive index lower than the fourth refractive index, and a sixth layer formed on the fifth layer and having a sixth refractive index higher than the fifth refractive index.

2. The semiconductor device according to claim 1, further comprising circuit elements formed in the first surface side of said semiconductor substrate,
   wherein said first multilayer laminated structure film is processed into a predetermined shape and is an alignment mark used upon formation of the circuit elements.

3. The semiconductor device according to claim 1, wherein the first layer and the fourth layer are formed of a material of the same refractive index, the second layer and the fifth layer are formed of a material of the same refractive index, and the third layer and the sixth layer are formed of a material of the same refractive index.

4. The semiconductor device according to claim 3, wherein the first layer and the fourth layer are respectively formed of polycrystalline silicon, the second layer and the fifth layer are respectively formed of a silicon oxide film, and the third layer and the sixth layer are respectively formed of polycrystalline silicon.

5. The semiconductor device according to claim 3, wherein the first layer and the fourth layer are formed with the same thickness, the second layer and the fifth layer are formed with the same thickness, and the third layer and the sixth layer are formed with the same thickness.

6. The semiconductor device according to claim 1, wherein the thicknesses of the respective layers of the first multilayer laminated structure film, and the thicknesses of the respective layers of the second multilayer laminated structure film are respectively thicknesses calculated by $(2N+1)\lambda/(4n)$ where the wavelength of light used for detecting the first and second multilayer laminated structure films is defined as $\lambda$, the refractive indices of the respective layers are defined as n, and N is defined as 0 or a natural number.

7. The semiconductor device according to claim 6, wherein the thicknesses of the respective layers of the first multilayer laminated structure film and the second multilayer laminated structure film are respectively thicknesses obtained where N=0 at $(2N+1)\lambda/(4n)$.

8. The semiconductor device according to claim 7, wherein the first layer and the fourth layer are formed of polycrystalline silicon having a thickness of 42 nm, the second layer and the fifth layer are formed of a silicon oxide film having a thickness of 110 nm, and the third layer and the sixth layer are formed of polycrystalline silicon having a thickness of 42 nm.

9. A semiconductor wafer comprising:
a semiconductor substrate having a first surface and a second surface, said semiconductor substrate having a semiconductor layer including the first surface, and a sapphire substrate including the second surface;
a first multilayer laminated structure film formed in the first surface of said semiconductor substrate, said first multilayer laminated structure film having a first layer having a first refractive index, a second layer formed on the first layer and having a second refractive index lower than the first refractive index, and a third layer formed on the second layer and having a third refractive index higher than the second refractive index; and
a second multilayer laminated structure film formed in the second surface of said semiconductor substrate, said second multilayer laminated structure film having a fourth layer having a fourth refractive index, a fifth layer formed on the fourth layer and having a fifth refractive index lower than the fourth refractive index, and a sixth layer formed on the fifth layer and having a sixth refractive index higher than the fifth refractive index.

* * * * *